United States Patent
Zhu

(10) Patent No.: US 11,329,149 B2
(45) Date of Patent: May 10, 2022

(54) SEMICONDUCTOR DEVICE WITH COMPACT CONTACT PORTION, METHOD OF MANUFACTURING THE SAME AND ELECTRONIC DEVICE INCLUDING THE SAME

(71) Applicant: Institute of Microelectronics, The Chinese Academy of Sciences, Beijing (CN)

(72) Inventor: Huilong Zhu, Poughkeepsie, NY (US)

(73) Assignee: Institute of Microelectronics, The Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/966,862

(22) PCT Filed: Oct. 31, 2018

(86) PCT No.: PCT/CN2018/113046
§ 371 (c)(1),
(2) Date: Jul. 31, 2020

(87) PCT Pub. No.: WO2020/073379
PCT Pub. Date: Apr. 16, 2020

(65) Prior Publication Data
US 2021/0043762 A1     Feb. 11, 2021

(30) Foreign Application Priority Data
Oct. 8, 2018   (CN) .......................... 201811171548.7

(51) Int. Cl.
*H01L 29/778*     (2006.01)
*H01L 29/06*      (2006.01)
(Continued)

(52) U.S. Cl.
CPC ...... *H01L 29/7788* (2013.01); *H01L 29/0649* (2013.01); *H01L 29/41741* (2013.01); *H01L 29/66553* (2013.01); *H01L 29/66666* (2013.01)

(58) Field of Classification Search
CPC ............. H01L 29/7788; H01L 29/0649; H01L 29/41741; H01L 29/66553;
(Continued)

(56) References Cited

U.S. PATENT DOCUMENTS

2015/0279780 A1* 10/2015 Zhang ............... H01L 21/76897
                                                         257/774
2016/0043194 A1*  2/2016 Masuoka .......... H01L 21/31111
                                                         257/372
(Continued)

FOREIGN PATENT DOCUMENTS

CN           107887441 A       4/2018

OTHER PUBLICATIONS

International Search Report and Written Opinion dated Jun. 27, 2019, issued in International Patent Application No. PCT/CN2018/113046, filed Oct. 31, 2018, 10 pages.

*Primary Examiner* — Mohammad M Hoque
(74) *Attorney, Agent, or Firm* — Davis Wright Tremaine LLP; Michael J. Donohue

(57) ABSTRACT

There are provided a vertical semiconductor device, a method of manufacturing the same, and an electronic device including the same. According to an embodiment, the semiconductor device may include a vertical active region disposed on a substrate and comprising a first source/drain layer, a channel layer and a second source/drain layer which are stacked in sequence; a gate stack surrounding at least a part of a periphery of the channel layer; and at least one of: a first electrical connection component for the first source/drain layer, comprising a first contact portion disposed
(Continued)

above a top surface of the active region and a first conductive channel in contact with the first contact portion and extending from the top surface of the active region to be in contact with at least a part of sidewalls of the first source/drain layer; and a second electrical connection component for the gate stack, comprising a second contact portion disposed above the top surface of the active region and a second conductive channel in contact with the second contact portion and extending from the top surface of the active region to be in contact with at least a part of sidewalls of a gate conductor layer in the gate stack.

19 Claims, 18 Drawing Sheets

(51) Int. Cl.
*H01L 29/417* (2006.01)
*H01L 29/66* (2006.01)

(58) Field of Classification Search
CPC ......... H01L 29/66666; H01L 29/42312; H01L 29/417; H01L 29/401; H01L 29/0653; H01L 29/7391; H01L 29/161; H01L 29/7827; H01L 29/66545
USPC ........................................................ 257/401
See application file for complete search history.

(56) References Cited

U.S. PATENT DOCUMENTS

| | | | |
|---|---|---|---|
| 2016/0148993 A1* | 5/2016 | Basu | H01L 29/1037 257/329 |
| 2017/0345927 A1* | 11/2017 | Cantoro | H01L 29/7827 |
| 2017/0352662 A1* | 12/2017 | Xu | H01L 29/66803 |
| 2018/0090598 A1* | 3/2018 | Xie | H01L 29/7827 |
| 2018/0097065 A1 | 4/2018 | Zhu | |
| 2018/0108577 A1 | 4/2018 | Zhu | |

* cited by examiner

SEMICONDUCTOR DEVICE WITH COMPACT CONTACT PORTION, METHOD OF MANUFACTURING THE SAME AND ELECTRONIC DEVICE INCLUDING THE SAME

CROSS-REFERENCE TO RELATED APPLICATION(S)

This application is a Section 371 National Stage Application of International Application No. PCT/CN2018/113046, filed on Oct. 31, 2018, which claims priority to the Chinese Patent Application No. 201811171548.7, filed on Oct. 8, 2018, entitled "SEMICONDUCTOR DEVICE, METHOD OF MANUFACTURING THE SAME, AND ELECTRONIC DEVICE INCLUDING THE SAME," which is incorporated herein by reference in its entirety.

TECHNICAL FIELD

The present disclosure relates generally to the semiconductor field, and more particularly, to a vertical semiconductor device having compact contact portions, a method of manufacturing the same, and an electronic device including the same.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

However, in the vertical device, since the source, the gate, and the drain are vertically stacked, contact portions, particularly contact portions to the gate and contact portions to the source or the drain in an underlying layer, need to have lateral offsets from an active region, which causes an increased area of the device.

SUMMARY

In view of the above, the present disclosure is directed to provide, among others, a vertical semiconductor device having compact contact portions, a method of manufacturing the same, and an electronic device including the same.

According to an aspect of the present disclosure, there is provided a vertical semiconductor device, comprising: a vertical active region disposed on a substrate and comprising a first source/drain layer, a channel layer and a second source/drain layer which are stacked in sequence; a gate stack surrounding at least a part of a periphery of the channel layer; and at least one of: a first electrical connection component for the first source/drain layer, comprising a first contact portion disposed above a top surface of the active region and a first conductive channel in contact with the first contact portion and extending from the top surface of the active region to be in contact with at least a part of sidewalls of the first source/drain layer; and a second electrical connection component for the gate stack, comprising a second contact portion disposed above the top surface of the active region and a second conductive channel in contact with the second contact portion and extending from the top surface of the active region to be in contact with at least a part of sidewalls of a gate conductor layer in the gate stack.

According to another aspect of the present disclosure, there is provided a method of manufacturing a vertical semiconductor device, comprising: forming, on a substrate, a stack of a first source/drain layer, a channel layer, and a second source/drain layer which are stacked in sequence; patterning the stack into a predetermined shape; forming a gate stack around at least a part of a periphery of the channel layer; forming an isolation layer on peripheries of the stack and the gate stack; forming a conductive channel on the top of the stack and on a surface of the isolation layer, wherein the predetermined shape and/or the formed gate stack cause the first source/drain layer or the gate stack to penetrate through the isolation layer to be in contact with the conductive channel; and forming a contact portion on the top of the stack so as to be in contact with the conductive channel.

According to yet another aspect of the present disclosure, there is provided an electronic device comprising the vertical semiconductor device described above.

According to the embodiments of the present disclosure, at least one of the first contact portion to the first source/drain layer and the second contact portion to the gate stack may be disposed on the top of the active region, thereby at least reducing or even eliminating lateral offsets of the contact portions, and thus reducing an area occupied by the entire device.

BRIEF DESCRIPTION OF THE DRAWINGS

The above and other objects, features, and advantages of the present disclosure will become more apparent from following descriptions of embodiments thereof with reference to attached drawings, in which:

FIGS. 1 to 17(c) are schematic views showing a flow of manufacturing a semiconductor device according to an embodiment of the present disclosure, wherein FIGS. 1 and 2 are cross-sectional views, FIGS. 3(b), 4, 5(a), 6(a), 7(a), 8(a), 9(a), 10(a), 11(a), 12(a), 13(a), 14(a), 15(a), 16(a) and 17(a) are cross-sectional views taken along line AA' in FIG. 3(a), FIGS. 5(b), 6(b), 7(b), 8(b), 9(b), 10(b), 11(b), 12(b), 13(b), 14(b), 15(b), 16(b) and 17(b) are cross-sectional views taken along line BB' in FIG. 3(a), and FIGS. 5(c), 6(c), 9(c), 10(c) and 17(c) are perspective views.

Throughout the drawings, like or similar reference numerals denote like or similar elements.

DETAILED DESCRIPTION

Figure 1:
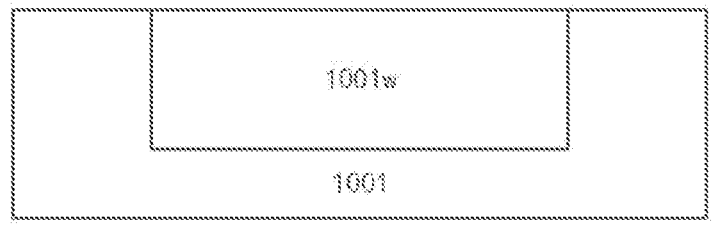

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn in scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" another layer/element, the layer/element can be disposed directly on the other layer/element, or otherwise there may be an intervening layer/element interposed therebetween. Further, if a layer/element is "on" another layer/element in an orientation, then the layer/element can be "under" the other layer/element when the orientation is turned.

A vertical semiconductor device according to embodiments of the present disclosure may comprise a vertical active region (in, for example, a direction substantially perpendicular to a substrate surface) disposed on a substrate, for example, a first source/drain layer, a channel layer and a second source/drain layer stacked on the substrate in sequence. Source/drain regions of the device may be formed in the first source/drain layer and the second source/drain layer, while a channel region of the device may be formed in the channel layer. A conductive channel may be formed through the channel region between the source and drain regions at opposite sides of the channel region.

According to embodiments of the present disclosure, the semiconductor device may be a conventional Field Effect Transistor (FET). In a case of the FET, the first source/drain layer and the second source/drain layer (or source/drain regions at opposite sides of the channel layer) may have the same conductivity type of doping (for example, n-type doping or p-type doping). A conductive channel may be formed by the channel region between the source and drain regions at the opposite sides of the channel region. Alternatively, such a semiconductor device may be a tunneling FET. In a case of the tunneling FET, the first source/drain layer and the second source/drain layer (or source and drain regions at opposite sides of the channel layer) may have different conductivity types of doping (for example, n-type doping and p-type doping respectively). In this case, charged particles such as electrons may tunnel from the source region into the drain region through the channel region, thereby forming a conductive path between the source and drain regions. Although the conventional FET and the tunneling FET have different conduction mechanisms, they both exhibit such an electrical property pf controlling the conduction between the source and drain regions by the gate. Therefore, for both the conventional FET and the tunneling FET, descriptions are made by collectively using the terms "source/drain layer (source/drain region)" and "channel layer (channel region)," although there is no common "channel" in the tunneling FET.

A gate stack may be formed to surround at least a part of a periphery of the channel layer. The gate stack may be substantially coplanar with the channel layer. For example, an upper surface of the gate stack may be substantially coplanar with an upper surface of the channel layer, and a lower surface of the gate stack may be substantially coplanar with a lower surface of the channel layer. Thereby, it is possible to reduce or even avoid the overlapping of the gate stack with the source/drain regions, which facilitates in reducing parasitic capacitance between the gate and the source/drain.

The channel layer may be made of a monocrystalline semiconductor material, so as to improve device performances. Of course, the first source/drain layer and the second source/drain layer may also be made of a monocrystalline semiconductor material. In this case, the monocrystalline semiconductor material of the channel layer and the monocrystalline semiconductor material of the source/drain layers may be a eutecticum.

According to embodiments of the present disclosure, the channel layer may have etching selectivity with respect to the first source/drain layer and the second source/drain layer, for example, having different semiconductor materials. Thus, it is advantageous to process the channel layer, by for example, selective etching. Further, the first source/drain layer and the second source/drain layer may comprise the same semiconductor material.

According to embodiments of the present disclosure, a leakage suppression layer or an ON current enhancement layer may further be disposed between the first source/drain layer and the channel layer, and/or between the channel layer and the second source/drain layer (in a case of the tunneling FET, particularly between two layers constituting a tunneling junction). The leakage suppression layer may have a band gap greater than that of at least one of upper and lower layers adjacent thereto. The ON current enhancement layer may have a band gap less than that of at least one of upper and lower layers adjacent thereto. Due to differences between the band gaps, it is possible to suppress leakage or enhance the ON current.

According to embodiments of the present disclosure, at least one of a first contact portion to the first source/drain layer and a second contact portion to the gate stack may be disposed on the top of the active region to at least partially overlap a main body of the active region (and the gate stack surrounding the channel layer), so as to save the occupied area. For example, at least one of the first contact portion and the second contact portion may be at least partially located within a region defined by peripheries of respective layers in the active region and the gate stack surrounding the channel layer. Due to such an overlap, it is not desirable that the first contact portion and/or the second contact portion directly extend vertically to the corresponding first source/drain layer and/or gate stack, since it is likely to be required to penetrate through the second source/drain layer (and possibly the channel layer and the gate stack), which may cause unnecessary electrical connections. To this end, the first contact portion may be electrically connected to the first source/drain layer by extending from the top of the active region to a first conductive channel in contact with the first source/drain layer, and/or the second contact portion may be electrically connected to the gate stack by extending from the top of the active region to a second conductive channel in contact with the gate stack.

According to embodiments of the present disclosure, the conductive channels may extend on the top of the active region from the respective contact portions toward a periphery of the active region, and then extend vertically (downward) to be in contact with the first source/drain layer or the gate stack (particularly, sidewalls thereof). In this way, the conductive channels may bypass the active region and make electrical connections with respective layers outside the active region by contacting sidewalls of the respective layers.

According to embodiments of the present disclosure, an isolation layer may be formed on the sidewalls of the peripheries of the active region and the gate stack to avoid undesired electrical connections between the respective layers in the active region and the gate stack and the conductive channels. For a layer which is not desired to be electrically connected to the conductive channels, outside sidewall of the layer may be recessed inwards with respect to a surface of the isolation layer and thus the layer is covered by the isolation layer. Thereby, the isolation layer may prevent the layer from being in contact with the conductive channels to make an electrical connection therebetween. On the other hand, for a layer which is desired to be electrically connected to the conductive channel, the layer (particularly, sidewalls thereof) may be exposed through the isolation layer at least in a certain region, and thus the layer is in contact with the conductive channel to make an electrical connection therebetween. This may be implemented, for example, by causing the layer to protrude with respect to other layers at least in the region. In this case, the isolation layer may expose the layer while overlapping the other layers.

In a case where the first contact portion and the second contact portion are both disposed on the top of the active layer, the first conductive channel and second conductive channel corresponding to the first contact portion and the second contact portion may extend in different regions, for example, may be located at opposite sides respectively, so as to avoid interference with each other. According to embodiments of the present disclosure, the first conductive channel and the second conductive channel may be formed by the same process, and thus may have, for example, the same material and/or the same size (height, thickness, or width, and the like).

Similarly, a dielectric layer may be formed on the top of the active region to avoid undesired electrical connections between the contact portions formed on the top of the active region and the second source/drain layer as the top layer. Such a dielectric layer may be provided in combination with a hard mask layer described below, for example. As an example, the first contact portion and/or the second contact portion may be formed on the dielectric layer. According to embodiments of the present disclosure, a third contact portion to the second source/drain layer may be formed to penetrate through the dielectric layer to be in contact with the second source/drain layer.

Such a semiconductor device may be manufactured, for example, as follows.

According to embodiments of the present disclosure, a first source/drain layer, a channel layer, and a second source/drain layer may be formed in sequence on a substrate. For example, these layers may be formed by epitaxial growth. Since the layers are epitaxially grown respectively, there may be a clear crystalline interface between at least a pair of adjacent layers. In addition, the layers may be doped respectively, and then there may be a doping concentration interface between at least a pair of adjacent layers.

For a stack of the first source/drain layer, the channel layer, and the second source/drain layer (and a leakage suppression layer or an ON current enhancement layer, if any), active regions may be defined therein. For example, those layers may be selectively etched into a desired shape. Generally, the active region may have a pillar shape, and the respective layers may be recessed or protrude with respect to each other, so as to make desired electrical contact with a conductive channel which is subsequently formed, as described above. Then, a gate stack may be formed to surround at least a part of a periphery of the channel layer.

Further, a periphery of the channel layer may be recessed inwards with respect to peripheries of the first source/drain layer and the second source/drain layer, so as to define a space for receiving the gate stack. For example, this can be done by selective etching. In this case, the gate stack may be embedded into the recess.

An isolation layer may be formed on peripheries of the stack and the gate stack, so as to seal sidewalls which are not desired to be electrically connected, and expose sidewalls which are desired to be electrically connected. Then, a conductive channel extending from the top of the stack to a surface of the isolation layer and in contact with sidewalls exposed at the isolation layer may be formed, and a contact portion may be formed on the top of the stack to be in contact with the conductive channel.

Since the respective layers in the stack and the gate stack may be required to be relatively recessed/protrude with respect to each other, in order to facilitate in patterning, a hard mask layer may be provided on the top of the stack. The hard mask layer may define a position of a main body of the active region. A layer may be relatively recessed by selectively etching the layer (and thus other layers protrude with respect to the layer). In subsequent processes, by using sidewalls of a periphery of the hard mask layer as a reference, sidewalls of a periphery of a layer which is not desired to protrude relatively may be recessed inwards with respect to the sidewalls of the periphery of the hard mask layer, and sidewalls of a periphery of a layer which is desired to protrude relatively may be substantially coplanar with the sidewalls of the periphery of the hard mask layer. The hard mask layer can also be used as a mask in forming the isolation layer. Thereby, sidewalls of a periphery of the isolation layer may also be substantially coplanar with the sidewalls of the periphery of the hard mask layer, and may thus expose sidewalls of peripheries of relatively protruding layers.

For example, the stack may be patterned using the hard mask layer as a mask. After that, the channel layer may be selectively etched so that the channel layer has its periphery recessed inwards with respect to the periphery of the hard mask layer. A sacrificial gate may be formed in the recess which is formed by the channel layer with respect to the periphery of the hard mask layer. In a case where a first contact portion to the first source/drain layer is formed on the top of the stack, at least a part of the first source/drain layer is required to protrude relatively. To this end, for example, a first shielding layer may be formed in a first region, so as to shield sidewalls of the first source/drain layer in the first region. In a case where the first shielding layer exists, the first source/drain layer and the second source/drain layer are selectively etched, so that the peripheries thereof are recessed inwards with respect to the periphery of the hard mask layer. Thus, in the first region, the first source/drain layer protrudes with respect to the second source/drain layer. Here, remaining regions of the first source/drain layer other than the first region are recessed inwards, which is advantageous to form a second conductive channel to the gate stack as discussed below. After that, the first shielding layer may be removed. A first portion of the isolation layer may be formed in the recess which is formed by the first source/drain layer and the second source/drain layer with respect to the periphery of the hard mask layer. Then, a replacement gate process may be performed to replace the sacrificial gate with the gate stack. The gate stack may be selectively etched so that the gate stack is recessed inwards with respect to the periphery of the hard mask layer. Thus, the first source/drain layer also protrudes with respect to the gate stack in the first region. A second portion of the isolation layer is further formed in the recess which is formed by the gate stack with respect to the periphery of the hard mask layer. Thus, the isolation layer (the first portion of the isolation layer and the second portion of the isolation layer) seals the stack and the gate stack, except that the first source/drain layer is exposed in the first region. After that, the first conductive channel may be formed, and the first conductive channel may penetrate through the first region so as to be in contact with the first source/drain layer exposed in the first region.

In a case where a second contact portion to the gate stack is formed on the top of the stack, before the gate stack is selectively etched, a second shielding layer may be formed in a second region to shield sidewalls of the gate stack. Thus, after the gate stack is selectively etched, the gate stack may protrude with respect to the first source/drain layer and the second source/drain layer in the second region. After that, the second conductive channel may be formed, and the second conductive channel may penetrate through the second region to be in contact with the gate stack exposed in the second region.

The technology of the present disclosure can be implemented in various ways, some of which are exemplified in the following with reference to the drawings.

FIGS. 1 to 17(c) are schematic views showing a flow of manufacturing a semiconductor device according to an embodiment of the present disclosure.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate or the like. Hereinafter, for the convenience of description, the bulk Si substrate will be described by way of example.

A well region 1001w may be formed in the substrate 1001. If a p-type device is to be formed, the well region 1001w may be an n-type well; and if an n-type device is to be formed, the well region 1001w may be a p-type well. The well region 1001w may be formed by, for example, implanting a corresponding conductive type of dopants (p-type dopants such as B or In, or n-type dopants such as As or P) into the substrate 1001 and then performing a thermal annealing process, wherein a doping concentration may be about $1E17$-$2E19$ cm$^{-3}$. There are various ways in the art to configure such a well region, and details thereof will not be described here again.

Figure 2:
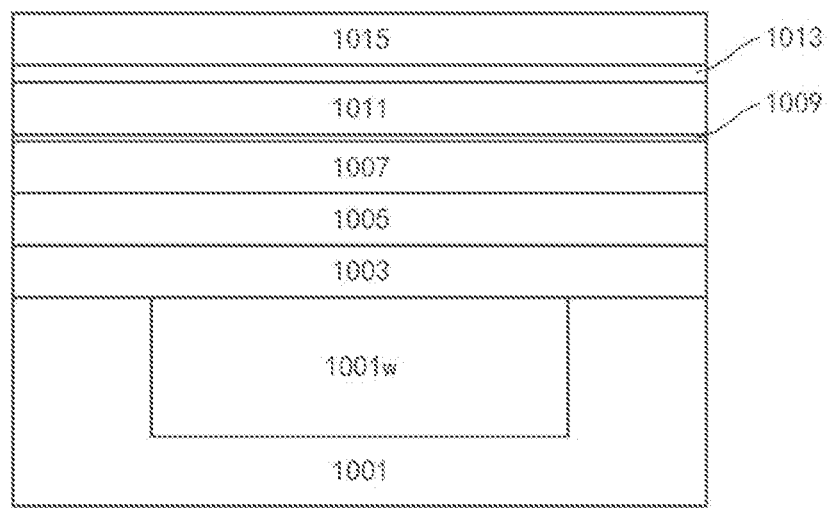

As shown in FIG. 2, a first source/drain layer 1003, a channel layer 1005, and a second source/drain layer 1007 may be formed in sequence on the substrate 1001 by, for example, epitaxial growth. All of these layers are semiconductor material layers. For example, the channel layer 1005 may include a semiconductor material different from those of the first source/drain layer 1003 and the second source/drain layer 1007, for example, SiGe (wherein Ge may have an atomic percentage of about 10-40%), with a thickness of about 10-100 nm; and the first source/drain layer 1003 and the second source/drain layer 1007 may include the same semiconductor material such as Si, with a thickness of about 10-50 nm. Of course, the present disclosure is not limited thereto. For example, the channel layer 1005 may include a semiconductor material, with the same components as the first source/drain layer 1003 or the second source/drain layer 1007, but with different contents of the components from the first source/drain layer 1003 or the second source/drain layer 1007 (for example, they all include SiGe, but with different atomic percentages of Ge), as long as the channel layer 1005 has etching selectivity with respect to the underlying first source/drain layer 1003 and the upper second source/drain layer 1007.

The first source/drain layer 1003, the channel layer 1005 and the second source/drain layer 1007 may be in-situ doped while being grown to have desired conductivity types and doping concentrations. For example, in a case of forming an n-type FET, n-type doping may be performed on the first source/drain layer 1003 and the second source/drain layer 1007 by using n-type impurities such as As or P, with a doping concentration of about $1E18$-$1E21$ cm$^{-3}$; and in a case of forming a p-type FET, p-type doping may be performed on the first source/drain layer 1003 and the second source/drain layer 1007 by using p-type impurities such as B or In, with a doping concentration of about $1E18$-$2E20$ cm$^{-3}$. The channel layer 1005 may be unintentionally doped or lightly doped to adjust a threshold voltage (Vt) of the device. In a case of forming a tunneling FET, opposite conductivity types of doping may be performed on the first source/drain layer 1003 and the second source/drain layer 1007. Of course, the doping is not limited to in-situ doping, and may also be performed in other manners such as ion implantation or the like.

A hard mask layer may be formed on the second source/drain layer 1007. The hard mask layer may include a stack of, for example, an etching stopper layer 1009, a first sub-mask layer 1011, and a second sub-mask layer 1015. Here, in order to facilitate in forming conductive channels below, a conductive material layer 1013 may be interposed between the first sub-mask layer 1011 and the second sub-mask layer 1015. Here, the first sub-mask layer 1011 (and the etching stopper layer 1009) has a dielectric material such as a low-k dielectric material, and may then be used to enable the electrical connection components such as contact portions and conductive channels or the like which are formed thereon to be electrically isolated from the underlying devices. For example, the etching stopper layer 1009 may include oxide (for example, silicon oxide) with a thickness of about 2-5 nm, and may be formed by deposition or thermal oxidation; the first sub-mask layer 1011 may include nitride (for example, silicon nitride) or a low-k dielectric material (for example, a silicon carbide-based material) with a thickness of about 10-100 nm, and may be formed by deposition; the conductive material layer 1013 may include a conductive material such as metal silicide (for example, Co-containing silicide, Ni-containing silicide, or Ti-containing silicide) with a thickness of about 5-20 nm, and may be formed by silicidation reaction; and the second sub-mask layer 1015 may include nitride with a thickness of about 10-100 nm, and may be formed by deposition.

Next, an active region may be defined for the device. For example, this can be done as follows.

Figure 3A:
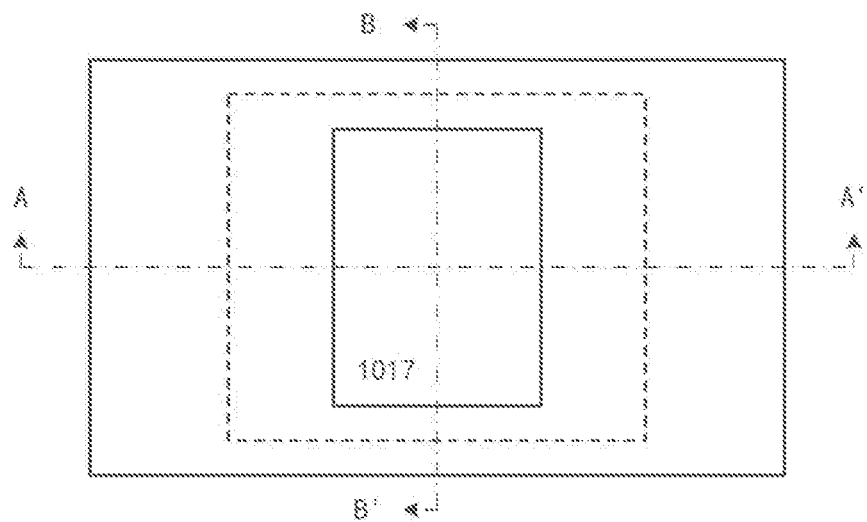
FIG. 3(a) is a plan view.
Figure 3B:
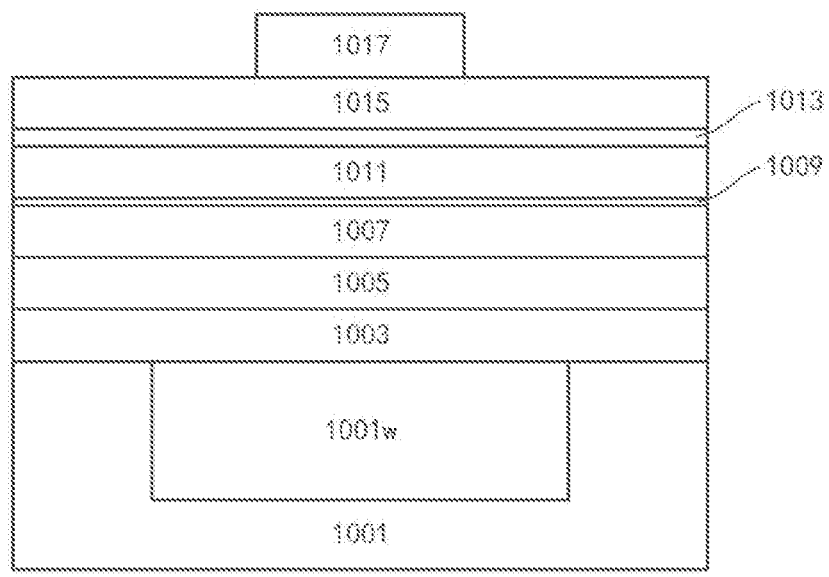

As shown in FIGS. 3(a) and 3(b), photoresist 1017 may be formed on the hard mask layer. The photoresist 1017 is patterned into a desired shape (a substantially rectangular shape in this example) by photolithography (exposure and development). As shown in the top view of FIG. 3(a), the pattern defined by the photoresist 1017 is within a range of the well region 1001w. Certainly, the pattern of the photoresist 1017 is not limited to a rectangular shape, but may be various other suitable shapes, such as a circular shape, an elliptical shape, a square shape, or the like.

Figure 4:
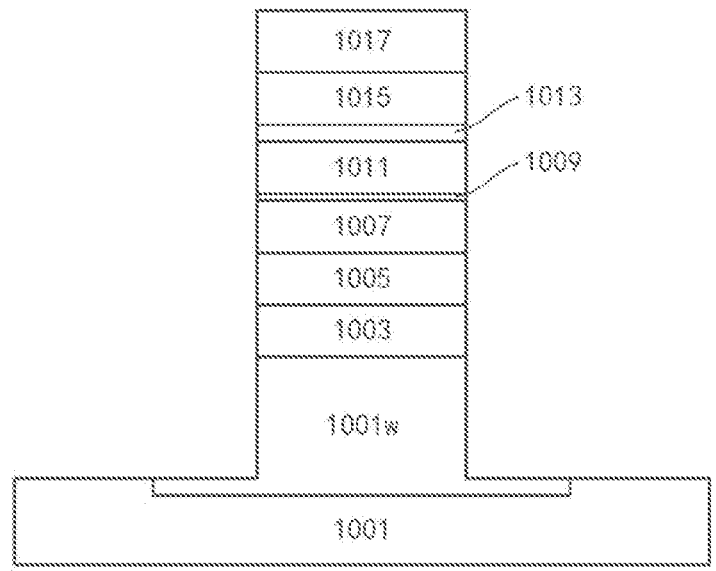

The pattern of the photoresist 1017 may then be transferred into the hard mask layer and in turn transferred into the underlying semiconductor layers. Specifically, as shown in FIG. 4, the hard mask layer, the second source/drain layer 1007, the channel layer 1005, and the first source/drain layer 1003 may be selectively etched in sequence by, for example, Reactive Ion Etching (RIE) with the patterned photoresist as a mask. In this example, the substrate 1001 (other than the bottom surface of the well region 1001w) may be etched, so as to form a trench in the substrate 1001. Then, a Shallow Trench Isolation (STI) can be formed in the trench. After being etched, the second source/drain layer 1007, the channel layer 1005, and the first source/drain layer 1003 have a pillar shape (a hexahedral pillar shape having a rectangular cross section in this example), which defines the active region. RIE may be performed, for example, in a direction substantially perpendicular to the substrate surface. Due to this, the pillar shape is also substantially perpendicular to the substrate surface. After that, the photoresist 1017 may be removed. At this time, sidewalls of peripheries of respective layers in the active region are substantially coplanar with those of a periphery of the hard mask layer. In subsequent processes, shapes of the respective layers in the active region may further be adjusted as needed (for example, the sidewalls of the respective layers are adjusted to be recessed).

Figure 5A:
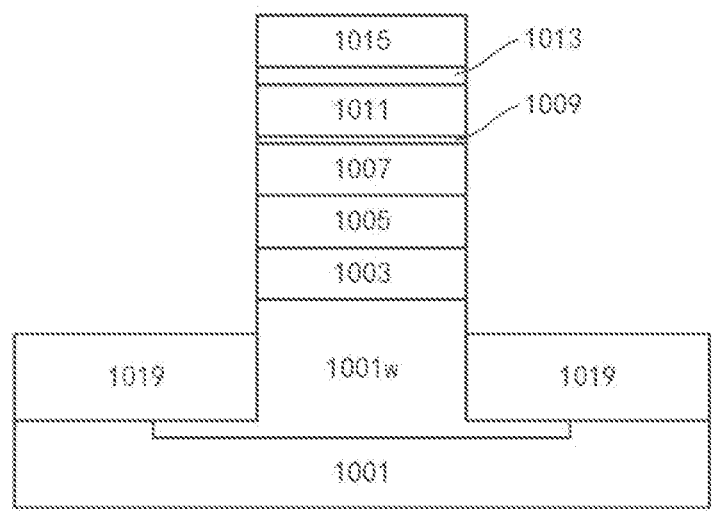
Figure 5B:
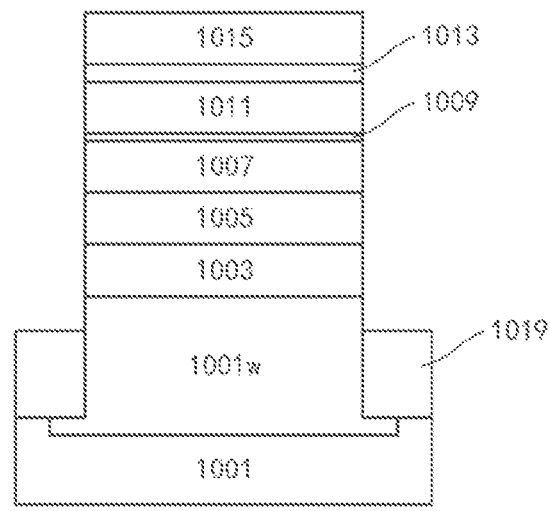
Figure 5C:
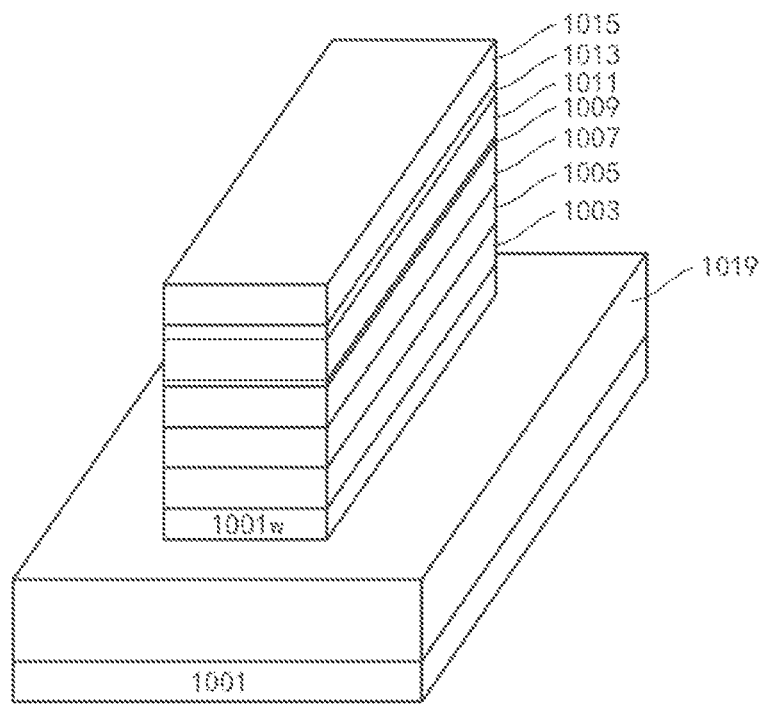

The trench formed in the substrate 1001 may be filled with a dielectric material to form the STI. For example, as shown in FIGS. 5(*a*), 5(*b*), and 5(*c*), oxide may be deposited on the structure shown in FIG. 4 and may be planarized by, for example, Chemical Mechanical Polishing (CMP) (with, for example, the hard mask layer such as the second sub-mask layer 1015 as a stopper layer) and etched back (by, for example, wet etching, vapor phase etching, vapor phase HF, or the like), so as to form the STI 1019. The STI 1019 is formed to surround the active region, achieving electrical isolation of active regions. Here, after being etched back, the STI 1019 may have a top surface lower than that of the substrate 1001, and thereby the STI 1019 may expose a portion of the well region 1001W.

Figure 6A:
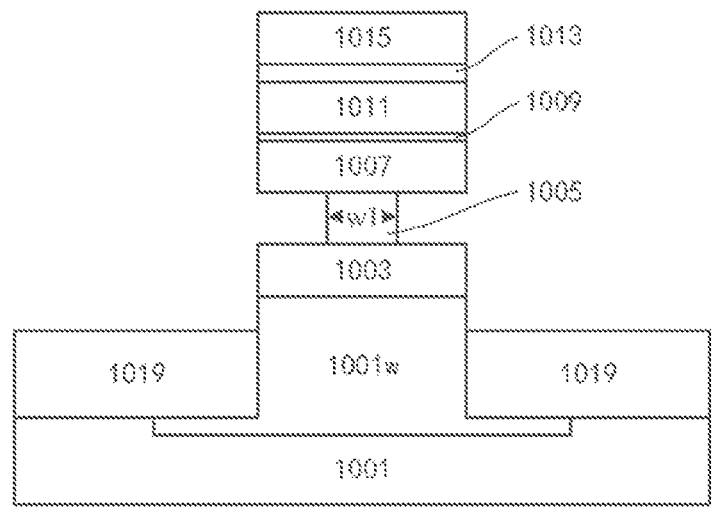
Figure 6B:
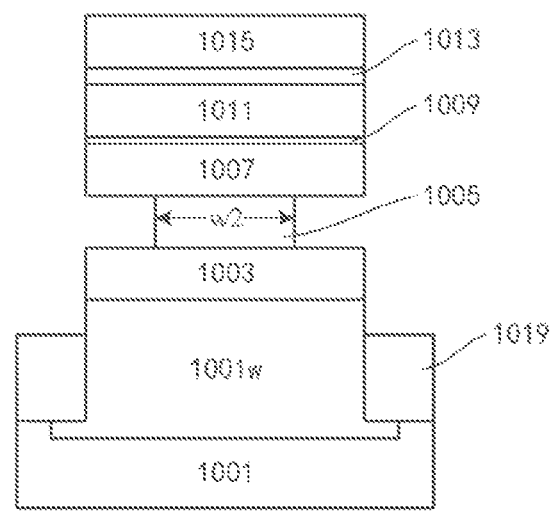
Figure 6C:
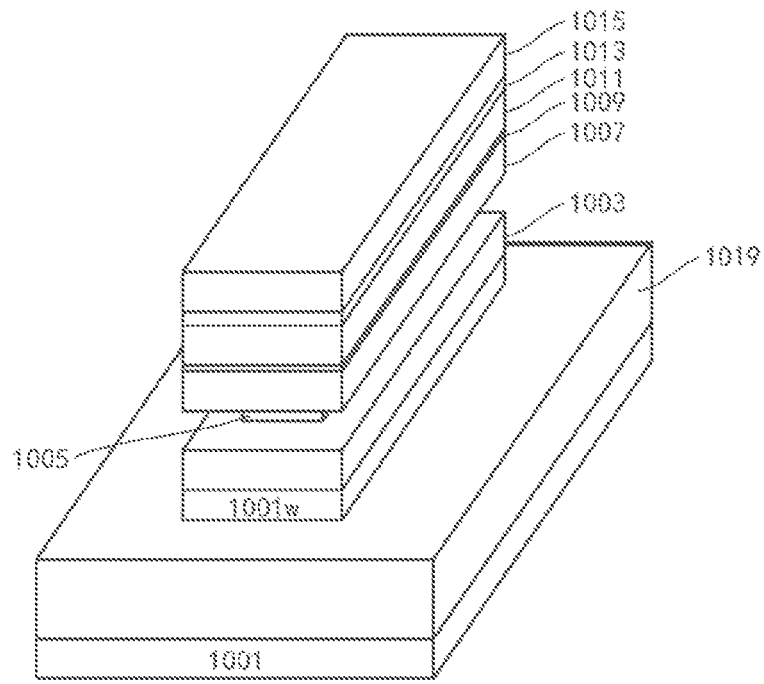

Then, as shown in FIGS. 6(*a*), 6(*b*), and 6(*c*), sidewalls of a periphery of the channel layer 1005 may be recessed (in this example, in a lateral direction substantially parallel to the substrate surface) with respect to those of the periphery of the hard mask layer, so that a gate stack may be subsequently formed within a range defined by the hard mask layer. This is advantageous since relative recession/protrusion of the respective layers in the active region and the gate stack may be defined by taking the sidewalls of the periphery of the hard mask layer as a reference. In one example, this can be achieved by further etching the channel layer 1005 selectively with respect to the first source/drain layer 1003 and the second source/drain layer 1007. As described above, since the channel layer 1005 has the etching selectivity with respect to the first source/drain layer 1003 and the second source/drain layer 1007, such selective etching may be implemented. The selective etching may be accurately controlled by using methods such as Atomic Layer Etching (ALE) or digital etching.

Such a recess which is formed by the periphery of the channel layer 1005 with respect to those of the first source/drain layer 1003 and the second source/drain layer 1007 facilitates in the subsequent formation of the gate stack. However, the present disclosure is not limited thereto. The sidewalls of the periphery of the channel layer 1005 may be recessed with respect to those of the periphery of the hard mask layer (so as to use the hard mask layer as a reference) instead of those of the peripheries of the first source/drain layer 1003 and the second source/drain layer 1007 (by, for example, etching the first source/drain layer 1003, the channel layer 1005 and the second source/drain layer 1007 to substantially the same extent). In this case, the gate stack may also be formed to surround the periphery of the channel layer 1005. There are various ways to configure the gate stack of the vertical device in the art, the detail of which will not be described here again.

In this example, it is assumed that the selective etching of the channel layer 1005 is performed substantially equally in all directions regardless of anisotropy. Then, after being etched, the channel layer 1005 still has a substantially rectangular shape having, for example, a short side in a length of w1 and a long side in a length of w2, wherein w1 may be used to control electrostatic characteristics of the device such as short channel effects and the like, and w2 may be used to define a width of the device or an amount of current which may be conducted.

Figure 7A:
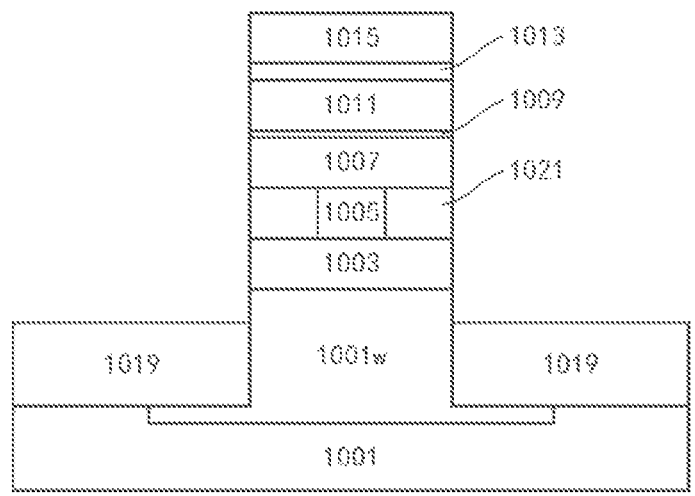
Figure 7B:
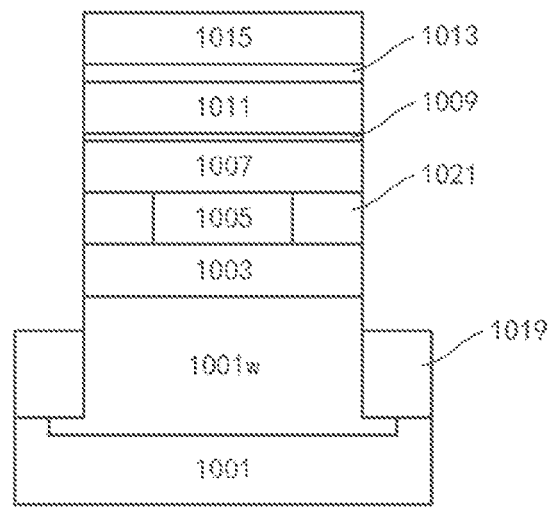

Then, a gate stack will be formed in the recess which is formed by the channel layer 1005 with respect to the peripheries of the first source/drain layer 1003 and the second source/drain layer 1007. To prevent the subsequent processes from impacting the channel layer 1005 or leaving unwanted material(s) in the recess which will influence the subsequent formation of the gate stack, a material layer may be filled in the recess, so as to occupy a space for the gate stack (and thus, this material layer may be referred to as a "sacrificial gate"). This can be done by, for example, depositing oxynitride (for example, silicon oxynitride) or silicon carbide (which is different from a material of the hard mask layer, so as to facilitate the subsequent selective etching) on the structure shown in FIGS. 6(*a*), 6(*b*) and 6(*c*), and then etching the deposited oxynitride or silicon carbide back by, for example, RIE. The RIE may be performed in a direction substantially perpendicular to the substrate surface, so that oxynitride or silicon carbide may only be retained within the recess, resulting in the sacrificial gate 1021, as shown in FIGS. 7(*a*) and 7(*b*). In this case, the sacrificial gate 1021 may substantially fill the recess up.

Next, shapes of the first source/drain layer 1003 and the second source/drain layer 1007 may be adjusted. In this example, a first contact portion to the first source/drain layer 1003 may be formed on the top of the active region, and thus at least a part of the first source/drain layer 1003 may relatively protrude.

Figure 8A:
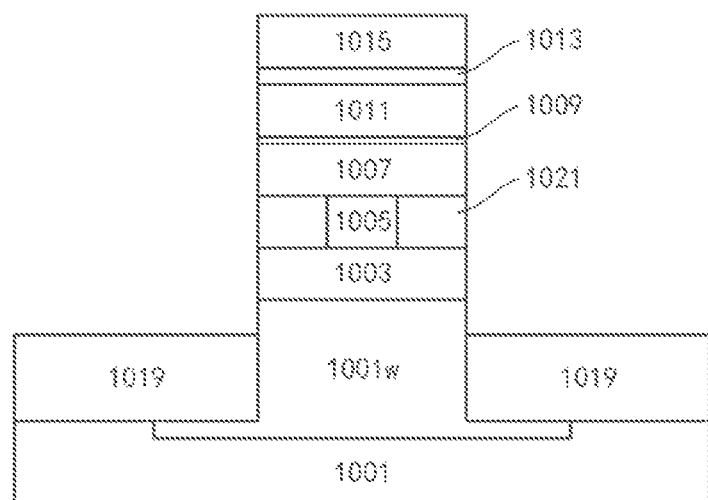
Figure 8B:
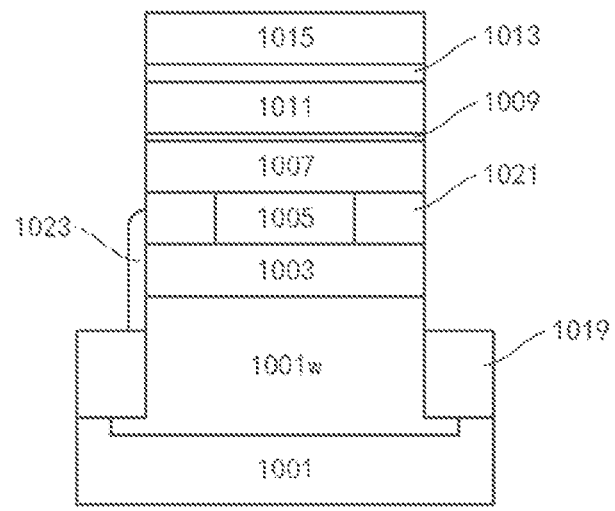

To this end, as shown in FIGS. 8(*a*) and 8(*b*), a first shielding layer 1023 may be formed in a region (referred to as a "first region") where the first source/drain layer 1003 is to relatively protrude, so as to shield the sidewalls of the first source/drain layer 1003. For example, a spacer may be formed on the STI 1019 in the structure shown in FIGS. 7(*a*) and 7(*b*) by a spacer formation process (for example, including a conformal deposition and a subsequent RIE in a vertical direction) to surround sidewalls of the protruding structure (1001w, 1003 and 1021) with respect to the STI 1019. For example, the sidewalls may include SiGe. Here, a height at which the spacer is formed may be controlled, so that the spacer may cover the sidewalls of the first source/drain layer 1003, but expose the sidewalls of the second source/drain layer 1007. For example, the spacer may have a top surface located between a top surface and a bottom surface of the channel layer 1005. Then, photoresist may be used to shield a portion of the spacer in the first region, and expose remaining portions of the spacer. The exposed portions of the spacer are removed by selective etching, such as RIE, so that the remaining portion of the spacer is left in the first region to form the first shielding layer 1023. Then, the photoresist may be removed.

In this example, the first shielding layer 1023 is formed only at a lower edge of the top view shown in FIG. 3(*a*) (and thus the first source/drain layer 1003 may then relatively protrude at the lower edge). However, the present disclosure is not limited thereto. The first shielding layer 1023 may shield more or even all sidewalls of the first source/drain layer 1003.

Figure 9A:
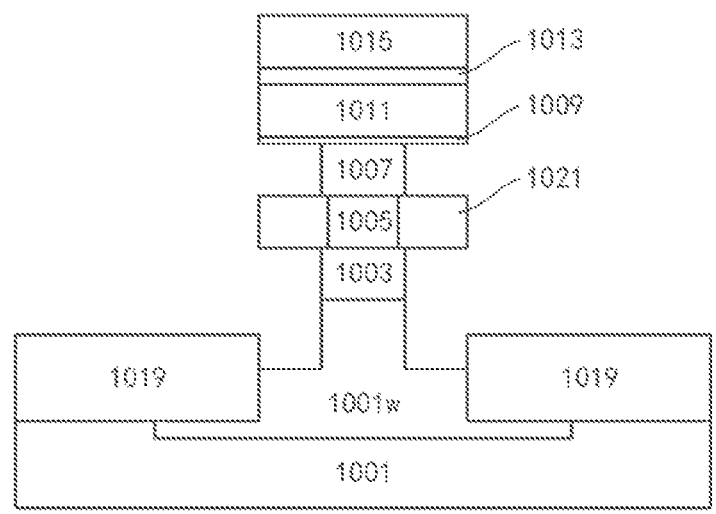
Figure 9B:
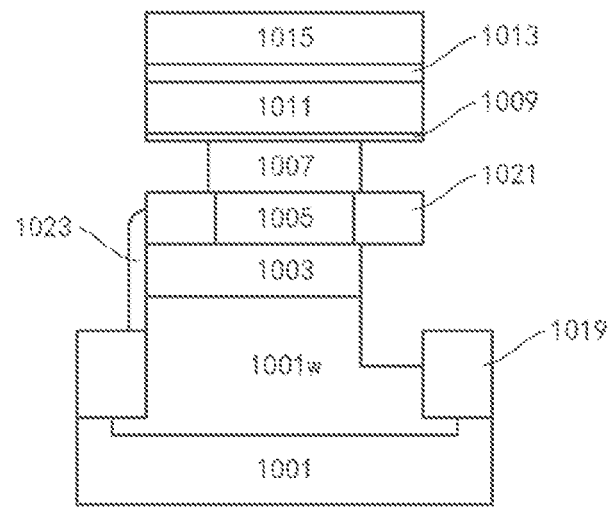
Figure 9C:
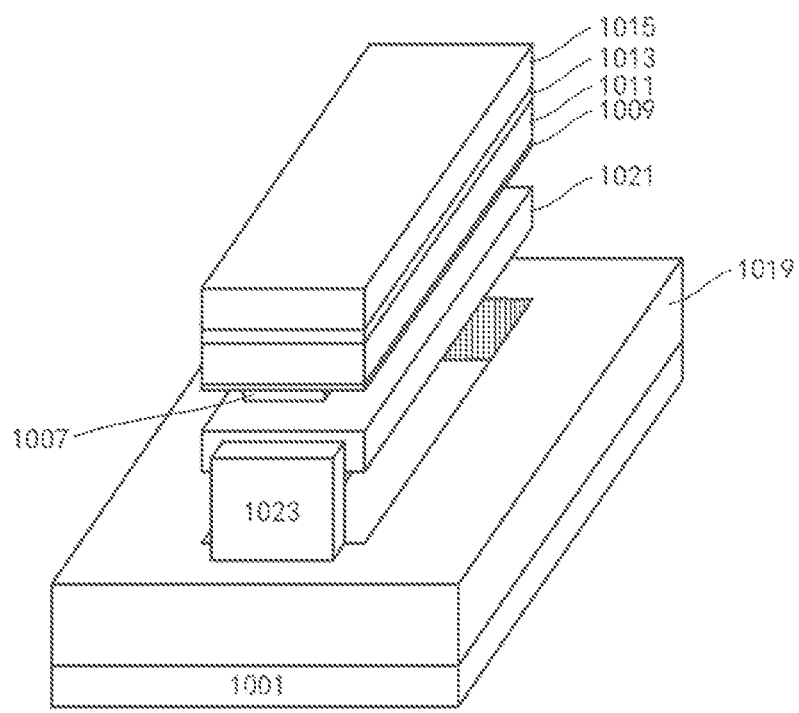

Then, as shown in FIGS. 9(*a*), 9(*b*), and 9(*c*), the sidewalls of the peripheries of the first source/drain layer 1003 and the second source/drain layer 1007 may be recessed with respect to those of the periphery of the hard mask layer. This can be done by selectively etching the first source/drain layer 1003 and the second source/drain layer 1007. Due to the existence of the first shielding layer 1023, the sidewalls of the first source/drain layer 1003 in the first region are not recessed and thus relatively protrude.

In the figures, it is shown that the sidewalls of the peripheries of the etched first source/drain layer 1003 and the etched second source/drain layer 1007 still protrude with respect to those of the periphery of the channel layer 1005. However, the present disclosure is not limited thereto. For example, the sidewalls of the peripheries of the etched first source/drain layer 1003 and the etched second source/drain layer 1007 may be substantially coplanar with those of the periphery of the channel layer 1005 or may even be recessed with respect to those of the periphery of the channel layer 1005. In order to avoid damage to the channel layer 1005, an etching recipe for the first source/drain layer 1003 and the second source/drain layer 1007 may be selected so as not to substantially impact the channel layer 1005.

In addition, in this example, since the substrate 1001 includes the same material (Si) as those of the first source/drain layer 1003 and the second source/drain layer 1007, the substrate 1001 may also be etched. Here, the etching does not go into the bottom of the well region 1001w.

Figure 10A:
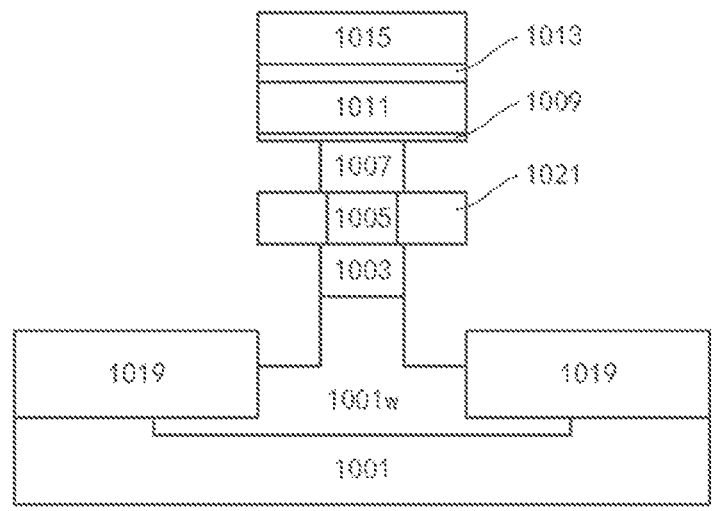
Figure 10B:
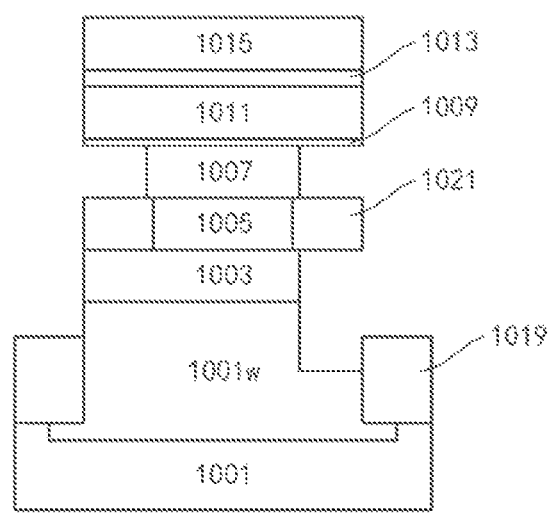
Figure 10C:
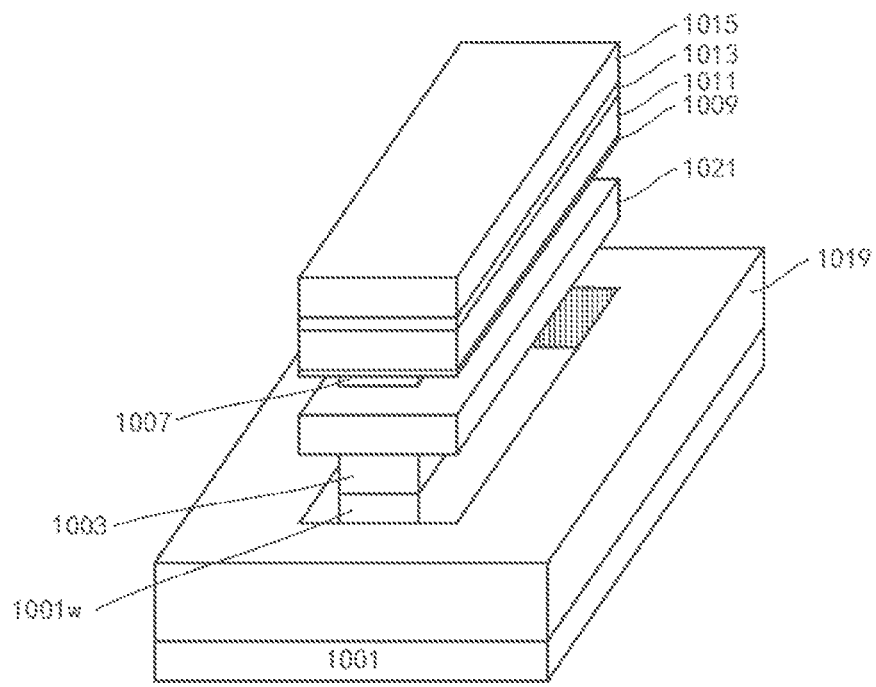

Next, as shown in FIGS. 10(a), 10(b), and 10(c), the first shielding layer 1023 may be removed by selective etching such as RIE. It may be clearly seen that, in the first region, the sidewalls of the first source/drain layer 1003 remain substantially coplanar with those of the periphery of the hard mask layer, and thus protrude with respect to those of the periphery of the second source/drain layer 1007.

In addition, in order to improve electrical contact characteristics, metal silicide may be formed on surfaces of the first source/drain layer 1003 and the second source/drain layer 1007. For example, a metal layer of, for example, Ni or NiPt may be formed on the structure shown in FIGS. 10(a), 10(b), and 10(c) by deposition such as Chemical Vapor Deposition (CVD), Atomic Layer Epitaxy (ALE), Physical Vapor Deposition (PVD) and the like. Then, silicidation reaction is implemented on the metal layer by annealing to produce metal silicide such as NiPtSi. After that, the unreacted metal layer may be removed.

Figure 11A:
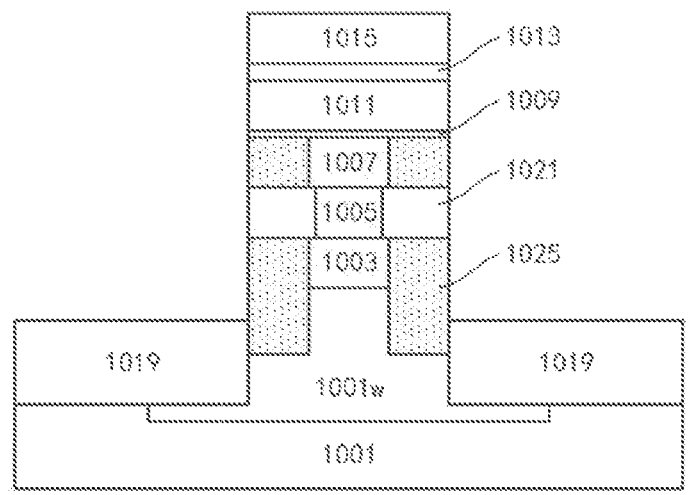
Figure 11B:
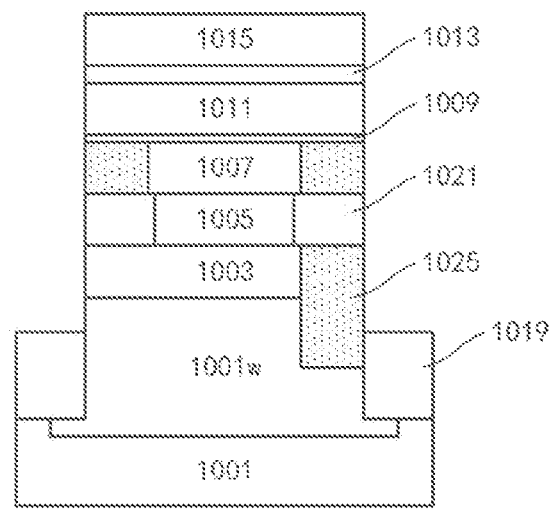

After the shapes of the first source/drain layer 1003 and the second source/drain layer 1007 are adjusted, a replacement gate process may be performed. In order to facilitate the replacement gate process, gaps under the hard mask layer may be filled up (to avoid the gate stack from being formed in these gaps). To this end, as shown in FIGS. 11(a) and 11(b), a dielectric layer, particularly, a low-k dielectric layer of for example, low-k silicon carbide, may be deposited on the structure shown in FIGS. 10(a), 10(b), and 10(c), and is then etched back to form an isolation layer 1025. The back etching can be done by performing RIE in a vertical direction, so that the isolation layer 1025 may be left under the hard mask layer, and the sidewalls of the periphery of the isolation layer 1025 may remain substantially coplanar with those of the periphery of the hard mask layer. Then, the sidewalls of the second source/drain layer 1007 are all covered by the isolation layer 1025, the sidewalls of the first source/drain layer 1003 in the first region are exposed, and the sidewalls of the first source/drain layer 1003 in remaining regions are covered by the isolation layer 1025.

Figure 12A:
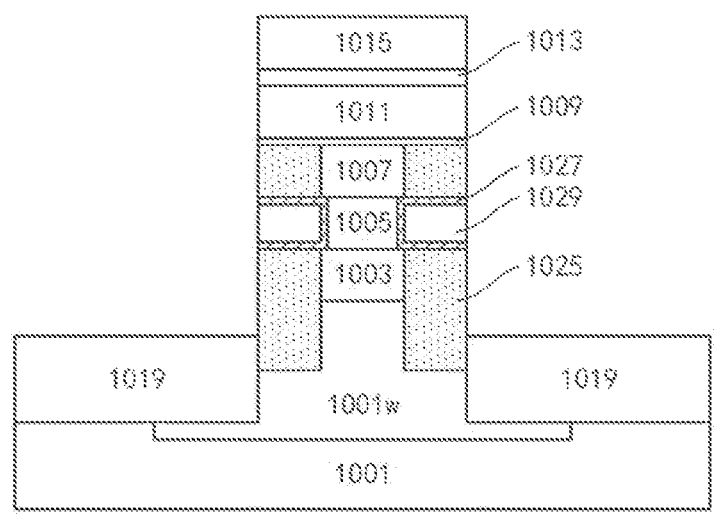
Figure 12B:
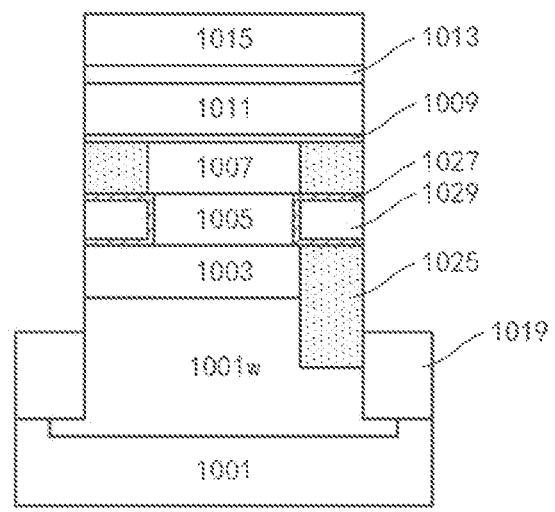

Then, a replacement gate process may be performed. For example, as shown in FIGS. 12(a) and 12(b), the sacrificial gate 1021 may be removed by selective etching to release the space in the recess and form a gate stack in the released space. Specifically, a gate dielectric layer 1027 and a gate conductor layer 1029 may be deposited in sequence on the structure shown in FIGS. 11(a) and 11(b) (from which the sacrificial gate 1021 is removed), and the deposited gate conductor layer 1029 (and optionally the deposited gate dielectric layer 1027) is etched back. The back etching can be done by performing RIE in a vertical direction. Thus, the gate stack may be left under the hard mask layer, and the sidewalls of the periphery of the gate stack may be substantially coplanar with those of the periphery of the hard mask layer. For example, the gate dielectric layer 1027 may include a high-k gate dielectric such as $HfO_2$; and the gate conductor layer 1029 may include a metal gate conductor. In addition, a work function adjustment layer may further be formed between the gate dielectric layer 1027 and the gate conductor layer 1029. Before the gate dielectric layer 1027 is formed, an interfacial layer of, for example, oxide, may further be formed.

Figure 13A:
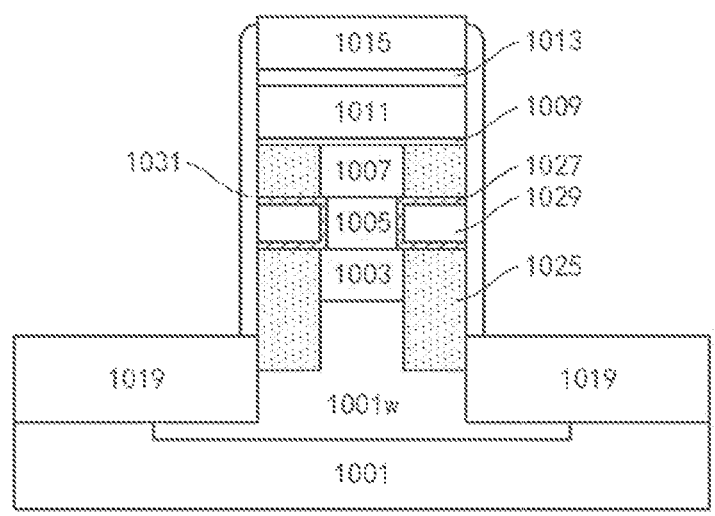
Figure 13B:
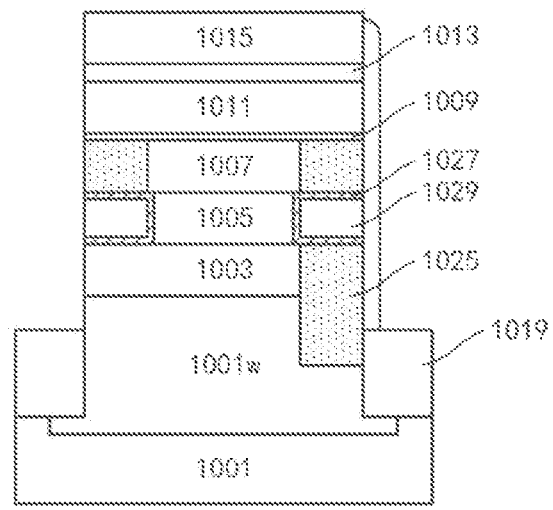

Since the sidewalls of the first source/drain layer 1003 and the gate stack, particularly, the gate conductor layer 1029, are substantially coplanar in the first region at this time (see sidewalls on the left in FIG. 12(b)), when a first conductive channel to the first source/drain layer 1003 is formed, the first conductive channel may also be in contact with the gate conductor layer 1029. To avoid this, the sidewalls of the gate stack, particularly, the gate conductor layer 1029, may be enabled to be relatively recessed at least in the first region. To this end, as shown in FIGS. 13(a) and 13(b), a second shielding layer 1031 may be formed in a second region different from the first region, so as to expose the sidewalls of the gate stack at least in the first region. For example, a spacer may be formed on the STI 1019 in the structure shown in FIGS. 12(a) and 12(b) by a spacer formation process to surround sidewalls of the protruding structure (the isolation layer, 1001w, the gate stack and the hard mask layer) with respect to the STI 1019. For example, the spacer may include nitride. In addition, an etching stopper layer, for example, a thin oxide layer (not shown in the figure), may be formed before the spacer is formed.

In this example, the second shielding layer 1031 exposes the gate stack in the first region. However, the present disclosure is not limited thereto. The second shielding layer 1031 may expose more sidewalls of the gate stack.

Figure 14A:
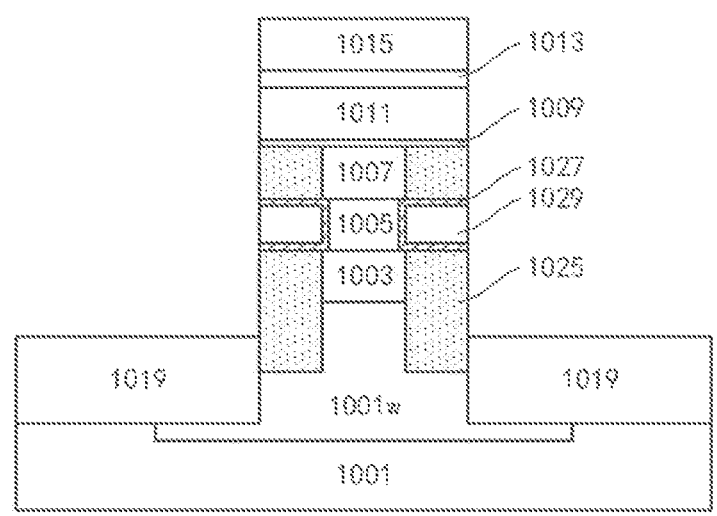
Figure 14B:
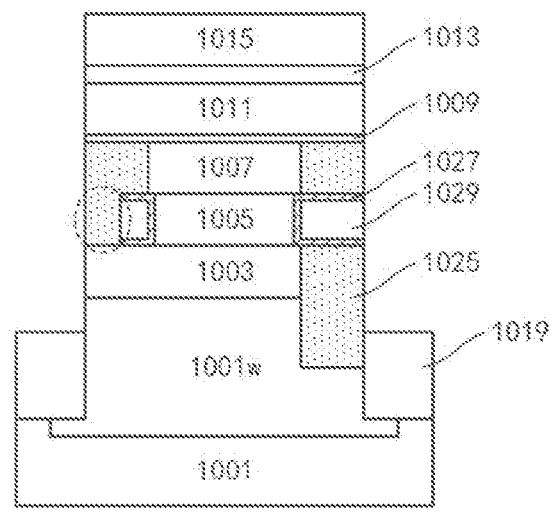

Then, as shown in FIGS. 14(a) and 14(b), the sidewalls of the periphery of the gate stack may be recessed with respect to those of the periphery of the hard mask layer. This can be done by etching back the gate dielectric layer 1027 and the gate conductor layer 1029. After that, the second shielding layer 1031 may be removed. Here, when the second shielding layer 1031 is being removed, the removing process may be stopped at the etching stopper layer of oxide, and then the etching stopper layer of oxide is removed. Thus, the second sub-mask layer 1015 of nitride may be retained.

Due to the arrangement of the second shielding layer 1031, the sidewalls of the gate stack are recessed (see a dotted circle in FIG. 14(b)) at least in the first region, so that the first source/drain layer 1003 protrudes with respect to the gate stack in the first region. In addition, due to the existence of the second shielding layer 1031, the gate stack is not recessed in the second region and thus relatively protrudes, so as to subsequently be in contact with a second conductive channel to the gate stack.

After the gate stack is etched back, a dielectric material may further be filled in a space due to the back etching (see a dotted circle in FIG. 14(b)). The dielectric material may be the same as that in the isolation layer 1025, and thus the dielectric material filled in the space and the dielectric material in the isolation layer 1025 are not distinguished from each other in the figures.

Due to the above processes, a protruding structure defined by the hard mask layer is formed over the isolation layer

1019. A periphery of the protruding structure is mostly covered by the isolation layer. Conductive channels may then be formed on a surface of the isolation layer. The first source/drain layer 1003 protrudes with respect to the second source/drain layer 1007 and the gate stack in the first region; and the gate stack protrudes with respect to the first source/drain layer 1003 and the second source/drain layer 1007 in the second region. Sidewalls of these protruding portions are substantially coplanar with those of the hard mask layer and are exposed on the surface of the isolation layer 1025. Thus, the conductive channels which are formed subsequently on the surface of the isolation layer 1025 may be in contact with the sidewalls of these protruding portions.

Figure 15A:
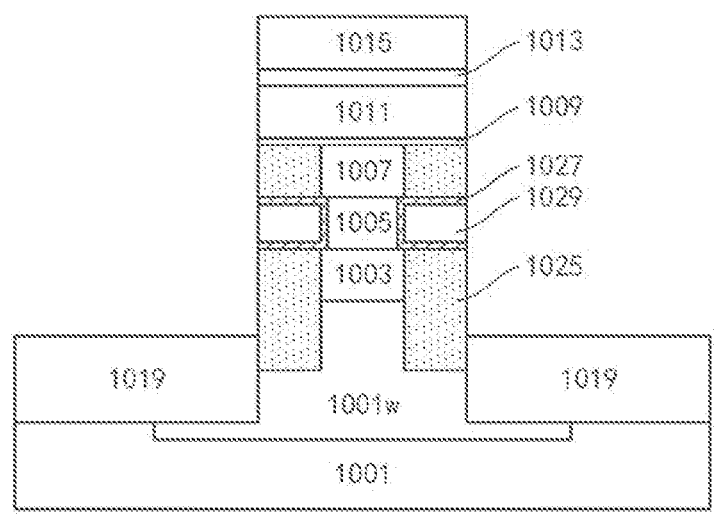
Figure 15B:
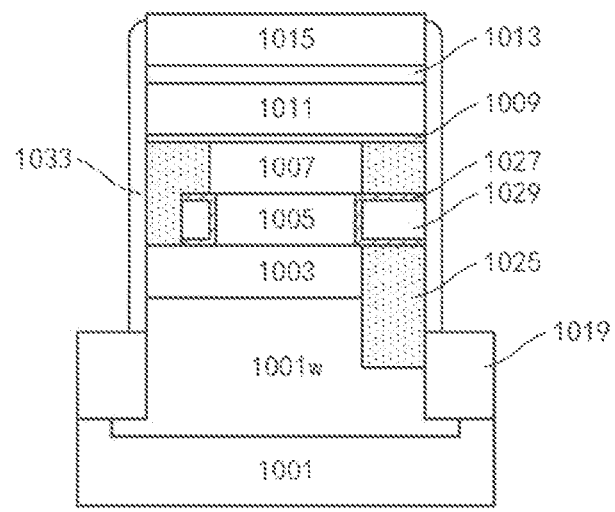

As shown in FIGS. 15(*a*) and 15(*b*), conductive channels 1033 may be formed on the surface of the isolation layer by, for example, a spacer formation process in combination with photolithography using a conductive material such as metal (for example, W and/or Co) or metal silicide (for example, Ni and/or Pt containing silicide). The conductive channels 1033 may be formed in the first region and the second region respectively, so as to be in contact with the first source/drain layer 1003 exposed in the first region and the gate stack exposed in the second region respectively. Here, the conductive channels 1033 may be formed on left and right sides in FIG. 15(*b*) (corresponding to upper and lower edges in the top view in FIG. 3(*a*)) respectively. The conductive channels on the opposite sides are in contact with the sidewalls of the first source/drain layer 1003 and the gate stack (particularly, the gate conductor layer 1029 therein). In addition, the conductive channels 1033 are in contact with sidewalls of the conductive material layer 1013.

According to other embodiments, the conductive channels 1033 may have stress for adjusting device performance. For example, for an n-type device, the conductive channels 1033 may have compressive stress to generate tensile stress in the channel layer 1005; and for a p-type device, the conductive channels 1033 may have tensile stress to generate compressive stress in the channel layer 1005.

Figure 16A:
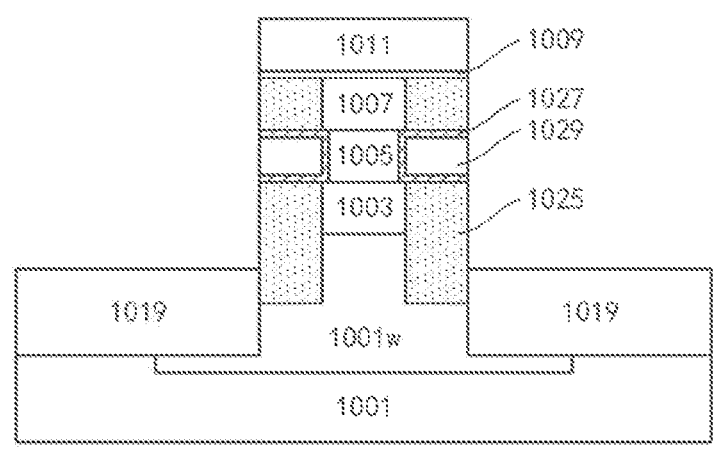
Figure 16B:
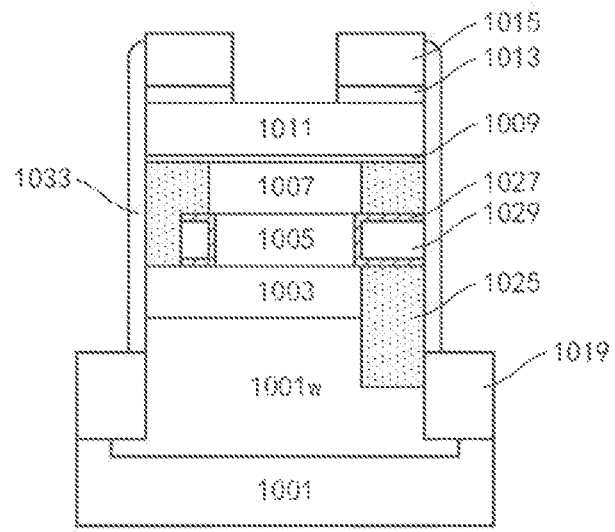

The conductive material layer 1013 may then be patterned to achieve required electrical isolation. For example, the conductive material layer 1013 may be cut off along line AA' in the top view of FIG. 3(*a*). This can be done by selectively etching the second sub-mask layer 1015 and the conductive material layer 1013 in sequence via, for example, RIE (by cutting off the mask). As shown in FIGS. 16(*a*) and 16(*b*), due to such cutting off, the conductive material layer 1013 and the conductive channels 1033 form two conductive channels which are separated from each other, respectively. Here, one of the two conductive channels is in contact with the first source/drain layer 1003, and the other of the two conductive channels is in contact with the gate stack (particularly, the gate conductor layer 1029 therein).

Figure 17A:
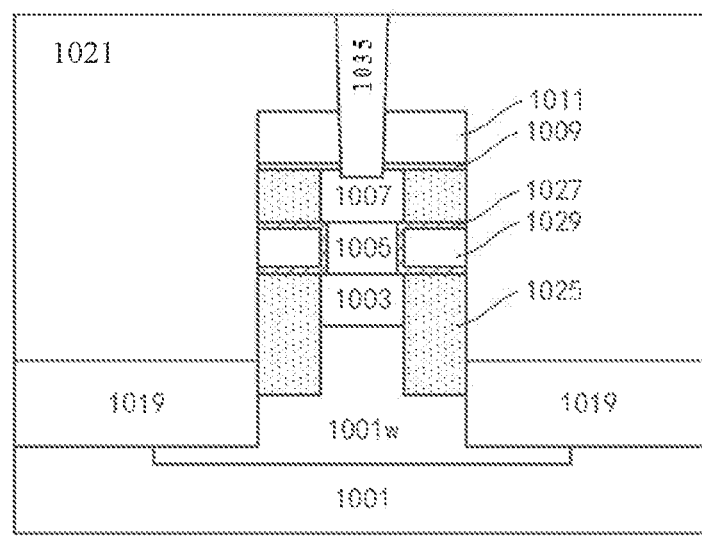
Figure 17B:
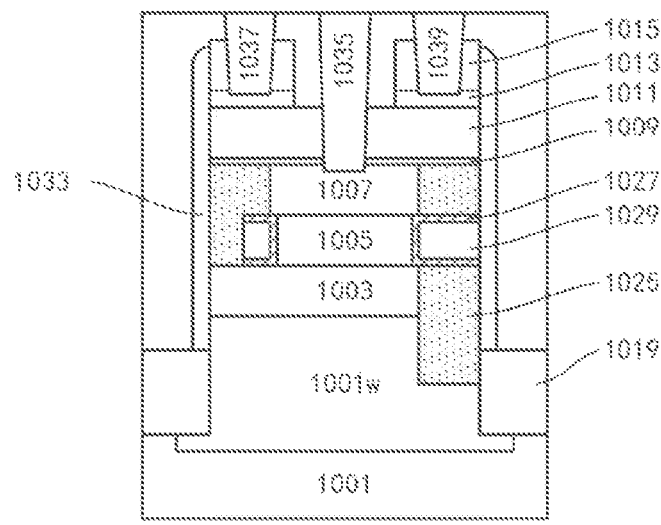
Figure 17C:
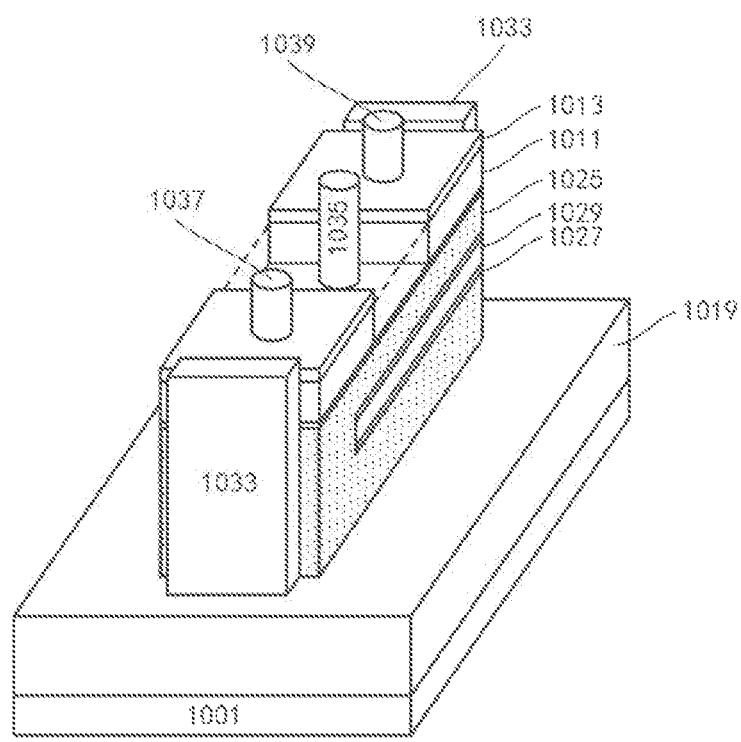

Then, as shown in FIGS. 17(*a*), 17(*b*), and 17(*c*), an interlayer dielectric layer 1035 is formed on the structure shown in FIGS. 16(*a*) and 16(*b*) (not all the layers, particularly, the interlayer dielectric layer 1035, are shown in FIG. 17(*c*) for sake of clarity). For example, an interlayer dielectric layer 1021 may be formed by depositing oxide and planarizing the oxide by, for example, CMP. Contacts 1035, 1037, and 1039 may be formed in the interlayer dielectric layer 1021. These contacts may be formed by etching holes and filling the holes with a conductive material such as metal. The contact 1035 extends vertically to the second source/drain layer 1007 to form an electrical connection component to the second source/drain layer 1007. The contact 1037 is electrically connected to the first source/drain layer 1003 through the conductive material layer 1013 and the conductive channels 1033, and the contact 1039 is electrically connected to the gate stack (particularly the gate conductor layer 1029 therein) through the conductive material layer 1013 and the conductive channels 1033.

In this example, the contacts 1035, 1037, and 1039 are arranged in a row in a substantially longitudinal direction of the active region (a direction of the long side of the rectangular active region), so that the contacts overlap a main body of the active region as much as possible while ensuring intervals between the respective contacts, thus saving more area.

In this example, both of the contacts 1037 and 1039 are formed on the top of the active region. However, the present disclosure is not limited thereto. For example, only one of the contacts 1037 and 1039 is formed on the top of the active region, and the other of the contacts 1037 and 1039 may be laterally shifted as in the conventional art. Of course, the contact 1035 is generally formed above the second source/drain layer 1007.

In addition, in the embodiments described above, electrical connection components to the first source/drain layer, the second source/drain layer, and the gate stack are formed respectively. However, the present disclosure is not limited thereto. Some layers may share electrical connection component(s). For example, the gate stack may be connected to one of the first source/drain layer and the second source/drain layer (in which case the device may be used as a diode). For example, when the gate stack may be electrically connected to the first source/drain layer, the operations described above in connection with FIGS. 13(*a*) to 14(*b*) may not be necessarily performed. In summary, the relative recession/protrusion relationship between the sidewalls of the layers may be appropriately adjusted according to the electrical connection components to be formed. This relative recession/protrusion may be adjusted by shielding a portion of the sidewalls (and thus the portion of the sidewalls is formed to relatively protrude) and selectively etching other portions of the sidewalls (and thus the other portions of the sidewalls are formed to be relatively recessed).

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a computer, a tablet Personal Computer (PC), a wearable intelligent device, a mobile power source, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure

I claim:

1. A vertical semiconductor device, comprising:
   a vertical active region disposed on a substrate and comprising a first source/drain layer, a channel layer and a second source/drain layer which are stacked in sequence;
   a gate stack surrounding at least a part of a periphery of the channel layer; and
   at least one of:
      a first electrical connection component for the first source/drain layer, comprising a first contact portion disposed above a top surface of the active region and a first conductive channel in contact with the first contact portion and extending from the top surface of the active region to be in contact with at least a part of sidewalls of the first source/drain layer, wherein the first contact portion at least partially overlaps the second source/drain layer in a vertical direction; and
      a second electrical connection component for the gate stack, comprising a second contact portion disposed above the top surface of the active region and a second conductive channel in contact with the second contact portion and extending from the top surface of the active region to be in contact with at least a part of sidewalls of a gate conductor layer in the gate stack, wherein the second contact portion at least partially overlaps the second source/drain layer in a vertical direction.

2. The vertical semiconductor device according to claim 1, further comprising:
   a third contact portion for the second source/drain layer, disposed on the top of the active region, wherein the third contact portion extends vertically to be in contact with the second source/drain layer.

3. The vertical semiconductor device according to claim 2, further comprising:
   a dielectric layer formed on the top of the active region, wherein the first contact portion and/or the second contact portion corresponding to at least one of the first electrical connection component and the second electrical connection component are formed on the dielectric layer, and the third contact portion is formed to penetrate through the dielectric layer.

4. The vertical semiconductor device according to claim 3, wherein the first conductive channel and/or the second conductive channel corresponding to at least one of the first electrical connection component and the second electrical connection component extend on the dielectric layer.

5. The vertical semiconductor device according to claim 2, wherein the first contact portion and/or the second contact portion corresponding to at least one of the first electrical connection component and the second electrical connection component and the third contact portion are arranged in a longitudinal extending direction of the active region on the top of the active region.

6. The vertical semiconductor device according to claim 1, further comprising:
   an isolation layer disposed on sidewalls of peripheries of the first source/drain layer, the second source/drain layer, and the gate stack,
   wherein at least one of the following is satisfied:
   the first conductive channel extends from the top surface of the active region to the isolation layer, wherein the first source/drain layer is in contact with the first conductive channel in a first region through the isolation layer; and
   the second conductive channel extends from the top surface of the active region to the isolation layer, wherein the gate stack is in contact with the second conductive channel in a second region through the isolation layer.

7. The vertical semiconductor device according to claim 6, wherein
   the isolation layer is formed to have a flat surface in a vertical direction, and
   at least one of the following is satisfied:
   in the first region, the periphery of the first source/drain layer protrudes outwards with respect to the periphery of the second source/drain layer and the periphery of the gate stack to be exposed at the surface of the isolation layer; and
   in the second region, the periphery of the gate stack protrudes outwards with respect to the periphery of the first source/drain layer and the periphery of the second source/drain layer to be exposed at the surface of the isolation layer.

8. The vertical semiconductor device according to claim 7, wherein sidewalls of the first source/drain layer exposed in the first region and/or sidewalls of the gate stack exposed in the second region are coplanar with the surface in the vertical direction.

9. The vertical semiconductor device according to claim 1, wherein the first conductive channel and/or the second conductive channel corresponding to at least one of the first electrical connection component and the second electrical connection component each comprise:
   a horizontal conductive channel portion disposed on the top of the active layer; and
   a vertical conductive channel portion which is in contact with the horizontal conductive channel portion.

10. The vertical semiconductor device according to claim 9, wherein the vertical conductive channel portion is in a form of spacer.

11. The vertical semiconductor device according to claim 9, wherein the vertical conductive channel portion of the first conductive channel and the vertical conductive channel portion of the second conductive channel are disposed on opposite sides of a periphery of the active region respectively.

12. The vertical semiconductor device according to claim 6, wherein the isolation layer comprises a low-k material.

13. The vertical semiconductor device according to claim 6, wherein the isolation layer comprises a carbon-containing silicide or silicon carbide.

14. The vertical semiconductor device according to claim 1, wherein the first conductive channel and/or the second conductive channel corresponding to at least one of the first electrical connection component and the second electrical connection component comprise metal silicide.

15. The vertical semiconductor device according to claim 1, wherein the first conductive channel and/or the second conductive channel are W-containing and/or Co-containing metal, or Ni-containing and/or P-containing silicide.

16. The vertical semiconductor device according to claim 1, wherein the first conductive channel and/or the second conductive channel have stress.

17. The vertical semiconductor device according to claim 16, wherein the vertical semiconductor device is an n-type Field Effect Transistor (FET), and the first conductive channel and/or the second conductive channel have compressive stress; or the vertical semiconductor device is a p-type FET, and the first conductive channel and/or the second conductive channel have tensile stress.

18. An electronic device comprising the vertical semiconductor device according to claim 1.

19. The electronic device according to claim 18, wherein the electronic device comprises a smart phone, a computer, a tablet computer, an artificial intelligence device, a wearable device, or a mobile power supply.

\* \* \* \* \*